Feb. 2, 1971 J. HAVOS 3,560,279

METHOD OF DOPING SEMICONDUCTOR MATERIAL

Filed Nov. 5, 1968

INVENTOR
JANOS HAVOS
BY Louis A Kline
John J. Callahan
John P. Tarlano
HIS ATTORNEYS 3,560,279

METHOD OF DOPING SEMICONDUCTOR MATERIAL

Janos Havas, Wappingers Falls, N.Y., assignor to The National Cash Register Company, Dayton, Ohio, a corporation of Maryland Filed Nov. 5, 1968, Ser. No. 773,410
Int. Cl. H01l 7/34
U.S. Cl. 148—188 6 Claims

ABSTRACT OF THE DISCLOSURE

The present invention relates to a method of forming a p-n junction in a semiconductor material wherein the region on one side of said p-n junction has a desired low dopant concentration and wherein said region is formed by doping said semiconductor material from a silicon dioxide layer made from a colloidal silicon dioxide-liquid-dispersion containing boron impurity atoms and counterdopant atoms.

The invention herein described was made in the course of or under a contract or subcontract thereunder, with the Department of the Air Force.

BACKGROUND OF THE INVENTION

Han Ying Ku, in United States patent application Ser. No. 637,509, filed May 10, 1967, now U.S. Pat. No. 3,514,-348 discloses a method of doping a silicon crystal using a colloidal silicon dioxide-liquid-dispersion and selected atoms. Ku assumed that the colloidal silicon dioxide-liquid-dispersion be initially pure. It is very difficult, however, to obtain pure colloidal silicon dioxide-liquid-dispersion, and commercial grade colloidal silicon dioxide-liquid-dispersion has boron impurity atoms thereon, which prevent doping to a low dopant concentration. The method of the present invention relates to a method of using commercial grade colloidal silicon dioxide-liquid-dispersion, which contains boron impurity atoms, to dope a silicon crystal to a low dopant concentration, as in silicon crystals used for complementary metal-oxide-semiconductor devices.

It has been found by experimental procedure that commercial grade colloidal silicon dioxide-liquid-dispersion has Group III boron impurity atoms therein. The method of the present invention partially negates the effect of the boron impurity atoms within the commercial grade colloidal silicon dioxide-liquid-dispersion, upon Group IV semiconductor material, such as silicon, by the use of Group V counterdopant atoms, such as phosphorus counterdopant atoms, dissolved in said commercial grade colloidal silicon dioxide-liquid-dispersion. It is preferable that these counterdopant atoms have the same diffusion coefficient as the boron impurity atoms into the silicon crystal. Phosphorus counterdopant atoms, in particular possess these desired properties. Therefore, the method of the present invention preferably relates to the use of phosphorus counterdopant atoms in commercial grade colloidal silicon dioxide-liquid-dispersion, which dispersion contains boron impurity atoms.

SUMMARY OF THE INVENTION

The present invention relates to a method of forming a doped region in a semiconductor material, said region having a desired low dopant concentration, wherein said region is formed by doping said semiconductor material from a silicon dioxide layer upon said semiconductor material, which layer is formed from a colloidal silicon dioxide-liquid-dispersion containing boron impurity atoms and counterdopant atoms, comprising doping a number of times regions of a semiconductor material, similar to said semiconductor material, from silicon dioxide layers containing identical amounts of boron impurity atoms but different amounts of counterdopant atoms, measuring the dopant concentrations in said regions as a result of said dopings, and doping a region of said semiconductor material from a silicon dioxide layer containing said boron impurity atoms and an amount of counterdopant atoms which is based on said dopant concentration measurements, to form a doped region having said desired low concentration, in said semiconductor material.

DESCRIPTION OF THE PREFERRED EMBODIMENT

Figure 1:
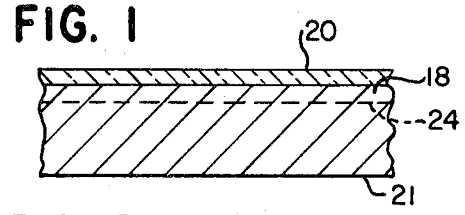
FIG. 1 is a plan view of a silicon crystal which has been doped using only commercial grade colloidal silicon dioxide-liquid-dispersion.

Ammonia-stabilized grade colloidal silicon dioxide-liquid-dispersion sold by E. I. du Pont de Nemours and Company under the trademark Ludox, diluted by a factor of thirty with deionized water, is used to form a 1250 angstrom silicon dioxide layer 20 on a substantially undoped n-type silicon crystal 21, as shown in FIG. 1. The silicon crystal 21 has a donor concentation of $1.5\times10^{14}$ donor atoms per cubic centimeter. The silicon crystal 21 is heated in a quartz-lined furnace, through which nitrogen is continually passed, so as to prevent unwanted impurities from entering the said quartz-lined furnace, for one half-hour at 1290 degrees centigrade. The silicon crystal 21 is then removed, and, by standard techniques, the depth of the p-n junction 24 formed therein is measured, as is the dopant concentration in the p-region 18 of said silicon crystal 21. The p-n junction 24 is found to be 4.3 microns below the surface of the silicon crystal 21, and the dopant concentration in the p-type region 18 is found to be $1.5\times10^{17}$ acceptor atoms per cubic centimeter.

Figure 2:
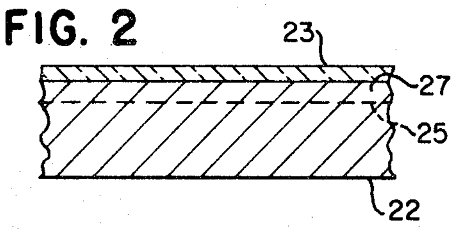
FIG. 2 is a plan view of a silicon crystal which has been doped using counterdoped commercial grade colloidal silicon dioxide-liquid-dispersion.

The diluted Ludox may be counterdoped by adding Group V counterdopant atoms, such as phosphorus counterdopant atoms, to said diluted Ludox to negate the effect on a silicon crystal of a portion of the boron impurity atoms. Arsenic, antimony, and bismuth can be used as well as phosphorus counterdopant atoms. Germanium can be used as well as silicon semiconductor material. In a substantially undoped n-type silicon crystal 22 of FIG. 2, phosphorus counterdopant atoms act as donors, while boron impurity atoms act as acceptors, so that the dopant concentration on a silicon crystal 22 is due to the portion of boron impurity atoms by which the number of boron impurity atoms is greater than the number of phosphorus counterdopant atoms.

10 miligrams of diammonium hydrogen phosphate, $(NH_4)_2HPO_4$, is added to a 100 milliliter unit of the diluted Ludox commercial grade colloidal silicon dioxide-liquid-dispersion. The silicon crystal 22 is spun at approximately 10,000 revolutions per minute, and single drops of said Ludox are intermittently placed on said silicon crystal 22 until a 1250 Angstrom silicon dioxide layer 23 is formed upon said silicon crystal 22. The silicon crystal 22 has an initial donor concentration of $1.5\times10^{14}$ donor atoms per cubic centimeter. The silicon crystal 22 is heated in a quartz furnace for one half-hour at 1290 degrees centigrade. The silicon crystal 22 is removed, and the depth of a p-n junction 25 formed therein is measured, as is the dopant concentration of a p-type region 27 formed therein. The p-n junction 25 is found to be 4.3 microns below the surface of the silicon crystal 22, and the dopant concentration in the p-type region 27 is found to be $8.5\times10^{16}$ acceptor atoms per cubic centimeter. This data (II) may be plotted in FIG. 4 along with the data (I) on silicon crystal 21, so as to show the decrease in the dopant concentration of the semiconductor material, as a function of the amount of $(NH_4)_2HPO_4$ added to 100 milliliters of Ludox.

Figure 3:
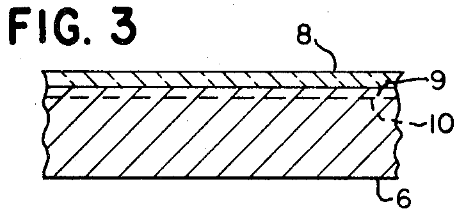
FIG. 3 is a plan view of a silicon crystal which has been doped using counterdoped commercial grade colloidal silicon dioxide-liquid-dispersion.

More $(NH_4)_2HPO_4$ is added to another 100 milliliter unit of diluted Ludox. That is, 20 milligrams of $$(NH_4)_2HPO_4$$

is added to another 100 milliliter unit of said diluted Ludox commercial grade colloidal silicon dioxide-liquid-dispersion. A 1250 angstrom silicon dioxide layer 8, as shown in FIG. 3, is formed from said counterdoped diluted Ludox upon a substantially undoped n-type silicon crystal 6 of FIG. 3, which silicon crystal 6 has a donor concentration of $1.5\times10^{14}$ donor atoms per cubic centimeter. The silicon crystal 6 is heated in a quartz furnace for one half-hour at 1290 degrees centigrade. A p-n junction 10 is found to have a depth of 2.87 microns below the surface of the silicon crystal 6. The dopant concentration of the p-type region 9 formed in the silicon crystal 6 is found to be $2\times10^{16}$ acceptor atoms per cubic centimeter. This data (III) is also plotted on the graph of FIG. 4. This data (III) aids in the determination of the decrease in the resultant dopant concentration in a substantially undoped silicon crystal as a function of the amount of counterdopant atoms added to said diluted Ludox.

Figure 5:
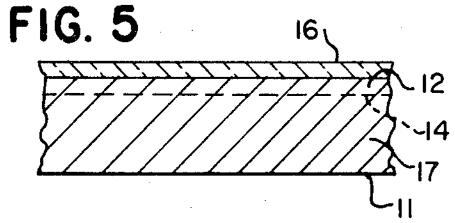
FIG. 5 is a plan view of a silicon crystal which has been doped using the decrease shown in FIG. 4.
Figure 4:
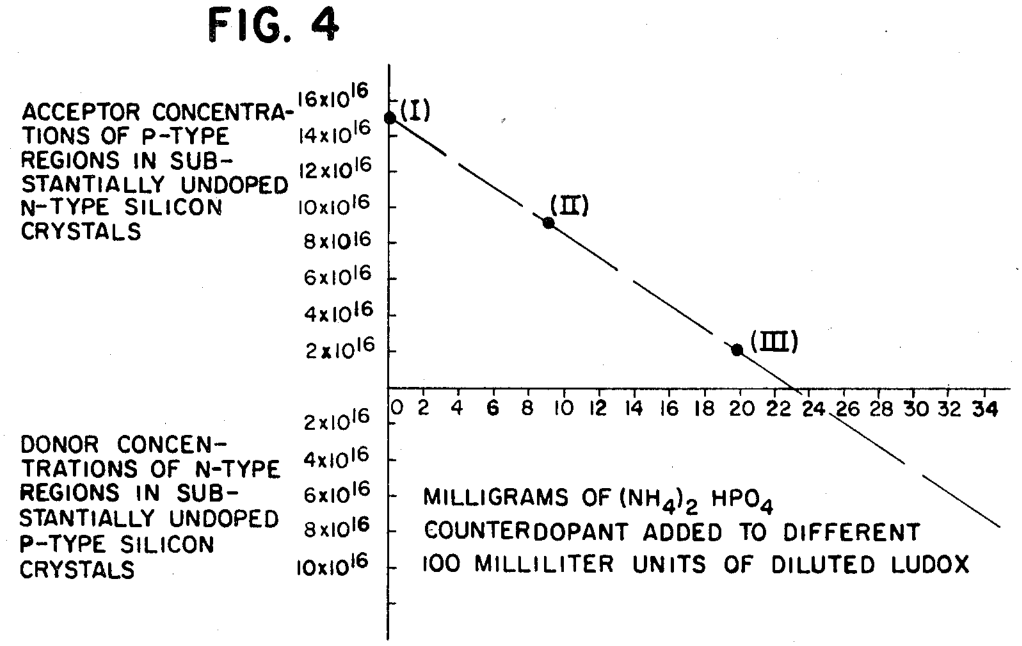
FIG. 4 is a graph of the decrease in dopant concentration produced in the silicon crystals of FIGS. 1, 2 and 3 as a function of different amounts of counterdopant atoms deposited in units of commercial grade colloidal silicon dioxide-liquid-dispersion.

From the graph of FIG. 4, one may determine the amount of $(NH_4)_2HPO_4$ which must be added to another 100 milliliter unit of diluted Ludox to obtain a dopant concentration of $3.0\times10^{16}$ acceptor atoms per cubic centimeter in a substantially undoped n-type silicon crystal. To obtain such a dopant concentration in a substantially undoped n-type silicon crystal 11 of FIG. 5, having a donor concentration of $1.5\times10^{14}$ donor atoms per cubic centimeter, a 1250 Angstrom silicon layer 16 is formed of Ludox having 18.3 milligrams of $(NH_4)_2HPO_4$ added to another 100 milliliter unit of said diluted Ludox. Heating the coated silicon crystal 11 for one half-hour in a quartz-lined furnace at 1290 degrees centigrade produces a dopant concentration of $3.0\times10^{16}$ acceptor atoms per cubic centimeter in a region 12 of said silicon crystal 11. The reference numeral 14 indicates the p-n junction between the p-type region 12 of the silicon crystal 11 and the n-type region 17 of the silicon crystal 11.

The graph of FIG. 4 may be used to determine the amount of $(NH_4)_2HPO_4$ which must be added to another 100 milliliter unit of diluted Ludox to obtain a dopant concentration of $3.0\times10^{16}$ donor atoms per cubic centimeter in a substantially undoped p-type silicon crystal. To obtain such a dopant concentration, 28 milligrams of $(NH_4)_2HPO_4$ should be added to another 100 milliliter unit of said diluted Ludox and the above procedure performed on said p-type silicon crystal.

What is claimed is:

1. A method of forming a doped region in a semiconductor material, said region having a desired low dopant concentration, wherein said region is formed by doping said semiconductor material from a silicon dioxide layer upon said semiconductor material, which layer is formed from a colloidal silicon dioxide-liquid-dispersion containing boron impurity atoms and counterdopant atoms, comprising:

(a) doping a number of times regions of a semiconductor material similar to said semiconductor material, from silicon dioxide layers containing identical amounts of boron impurity atoms but different amounts of counterdopant atoms;

(b) measuring the dopant concentrations in said regions as a result of said dopings; and (c) doping a region of said semiconductor material from a silicon dioxide layer containing said boron impurity atoms and an amount of counterdoping atoms which is based on said dopant concentration measurements, to form a doped region having said desired low concentration, in said semiconductor material.

2. A method of forming a p-n junction in a semiconductor material wherein the region on one side of said p-n junction has a desired low dopant concentration and wherein said region is formed by doping said semiconductor material from a silicon dioxide layer made from a colloidal silicon dioxide-liquid-dispersion containing boron impurity atoms and counterdopant atoms, comprising:

(a) doping a number of times semiconductor material similar to said semiconductor material from a silicon dioxide layer made from a colloidal silicon dioxide-liquid-dispersion containing identical amounts of boron impurity atoms but different amounts of counterdopant atoms;

(b) measuring the dopant concentration as a result of said dopings; and (c) doping said semiconductor material from a silicon dioxide layer made from a colloidal silicon-dioxide-liquid-dispersion containing said boron impurity atoms and an amount of counterdoping atoms based on said dopant concentration measurements to form said p-n junction having said desired low concentration.

3. A method of forming a p-type region in an n-type semiconductor material wherein the p-type region has a desired low dopant concentration and wherein said p-region is formed by doping said n-type semiconductor material from a silicon dioxide layer made from a colloidal silicon dioxide-liquid-dispersion containing boron impurity atoms and counterdopant atoms, comprising:

(a) doping a number of times n-type semiconductor material similar to said n-type semiconductor material from a silicon dioxide layer made from a colloidal silicon dioxide-liquid-dispersion containing identical amounts of boron impurity atoms but different amounts of counterdopant atoms;

(b) measuring the dopant concentration as a result of said dopings; and (c) doping said n-type semiconductor material from a silicon dioxide layer made from a colloidal silicon dioxide-liquid-dispersion containing said boron impurity atoms and a smaller amount of counterdopant atoms based on said doping concentration measurements to form said p-region having said desired low concentration.

4. The method as claimed in claim 3 wherein the semiconductor material is silicon semiconductor material.

5. The method as claimed in claim 4 wherein the counterdopant atoms are phosphorus counterdopant atoms.

6. A method of forming an n-region in a p-type semiconductor material wherein the n-region has a desired low dopant concentration and wherein said n-region is formed by doping p-type semiconductor material from a silicon dioxide layer made from a colloidal silicon dioxide-liquid-dispersion containing boron impurity atoms and counterdopant atoms, comprising:

(a) doping a number of times p-type semiconductor material similar to said p-type semiconductor material from said silicon dioxide layer made from a colloidal silicon dioxide-liquid-dispersion containing identical amounts of boron impurity atoms but different amounts of counterdopant atoms;

(b) measuring the dopant concentration as a result of said dopings; and (c) doping said p-type semiconductor material from said silicon dioxide layer made from a colloidal silicon dioxide-liquid-dispersion containing said boron impurity atoms and a larger amount of counterdopant atoms based on said doping concentration measurements to form said n-region having said desired low concentration.

References Cited

UNITED STATES PATENTS 3,514,348 5/1970 Ku ---------------- 148—188

L. DEWAYNE RUTLEDGE, Primary Examiner

R. A. LESTER, Assistant Examiner

U.S. Cl. X.R.

148—186, 187